(12) United States Patent
Kothari et al.

(10) Patent No.: US 10,930,659 B2
(45) Date of Patent: *Feb. 23, 2021

(54) METHODS OF IMPROVING ADHESION OF PHOTORESIST IN A STAIRCASE STRUCTURE AND METHODS OF FORMING A STAIRCASE STRUCTURE

(71) Applicant: Micron Technology, Inc., Boise, ID (US)

(72) Inventors: Rohit Kothari, Boise, ID (US); Jason C. McFarland, Boise, ID (US); Jason Reece, Boise, ID (US); David A. Kewley, Boise, ID (US); Adam L. Olson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/531,815

(22) Filed: Aug. 5, 2019

(65) Prior Publication Data

US 2019/0355735 A1    Nov. 21, 2019

Related U.S. Application Data

(63) Continuation of application No. 15/624,422, filed on Jun. 15, 2017.

(51) Int. Cl.
| | |
|---|---|
| *H01L 27/11556* | (2017.01) |
| *H01L 21/3213* | (2006.01) |
| *H01L 21/311* | (2006.01) |
| *H01L 27/11582* | (2017.01) |
| *G03F 7/00* | (2006.01) |

(52) U.S. Cl.
CPC .. *H01L 27/11556* (2013.01); *H01L 21/31144* (2013.01); *H01L 21/32139* (2013.01); *G03F 7/0035* (2013.01); *H01L 27/11582* (2013.01)

(58) Field of Classification Search
CPC ................................................. H01L 27/11556
See application file for complete search history.

(56) References Cited

U.S. PATENT DOCUMENTS

| | | | |
|---|---|---|---|
| 6,027,967 A | 2/2000 | Parekh et al. | |
| 6,380,628 B2 | 4/2002 | Miller et al. | |
| 9,406,609 B1 | 8/2016 | Lung | |
| 9,449,987 B1 | 9/2016 | Miyata et al. | |
| 9,978,768 B2 | 5/2018 | Xu et al. | |
| 2006/0267069 A1 | 11/2006 | Kajimoto et al. | |
| 2010/0025854 A1* | 2/2010 | Sinha | H01L 21/7684 257/770 |
| 2011/0244666 A1 | 10/2011 | Kim et al. | |

(Continued)

*Primary Examiner* — Mohammad M Choudhry
(74) *Attorney, Agent, or Firm* — TraskBritt (57) ABSTRACT

Methods of improving adhesion between a photoresist and conductive or insulating structures. The method comprises forming a slot through at least a portion of alternating conductive structures and insulating structures on a substrate. Portions of the conductive structures or of the insulating structures are removed to form recesses in the conductive structures or in the insulating structures. A photoresist is formed over the alternating conductive structures and insulating structures and within the slot. Methods of improving adhesion between a photoresist and a spin-on dielectric material are also disclosed, as well as methods of forming a staircase structure.

21 Claims, 10 Drawing Sheets

(56) References Cited

U.S. PATENT DOCUMENTS

| | | |
|---|---|---|
| 2012/0119283 A1 | 5/2012 | Lee et al. |
| 2013/0037879 A1 | 2/2013 | Filippini et al. |
| 2013/0320424 A1* | 12/2013 | Lee .................... H01L 27/1158 |
| | | 257/314 |
| 2014/0084357 A1* | 3/2014 | Choi ................... H01L 27/1157 |
| | | 257/324 |
| 2015/0155292 A1 | 6/2015 | Son et al. |
| 2015/0249053 A1 | 9/2015 | Or-Bach et al. |
| 2016/0064281 A1 | 3/2016 | Izumi et al. |
| 2016/0365407 A1* | 12/2016 | Lue ................... H01L 27/11548 |
| 2018/0006041 A1* | 1/2018 | Xu .................... H01L 21/02063 |

* cited by examiner

METHODS OF IMPROVING ADHESION OF PHOTORESIST IN A STAIRCASE STRUCTURE AND METHODS OF FORMING A STAIRCASE STRUCTURE

CROSS-REFERENCE TO RELATED APPLICATIONS

This application is a continuation of U.S. patent application Ser. No. 15/624,422, filed Jun. 15, 2017, now U.S. Pat. No. 10,600,796, issued Mar. 24, 2020, the disclosure of which is hereby incorporated herein in its entirety by this reference.

TECHNICAL FIELD

Embodiments disclosed herein relate to semiconductor fabrication including methods of forming semiconductor structures including staircase structures. More particularly, embodiments of the disclosure relate to methods of improving adhesion between photoresist or spin-on dielectric materials and adjacent materials in the staircase structures.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to implement vertical memory array (also referred to as a "three-dimensional (3D) memory array") architectures. A conventional vertical memory array includes transistor/memory-cell pillars extending through openings in repeating conducting/insulating structures films (e.g., tiers), where the conducting structures function as control gates. The vertically stacked tiers of conductive structures (e.g., word line plates, control gate plates) and insulating structures at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "staircase" structure having so-called "stairs" at edges (e.g., lateral ends) of the tiers of conductive structures. The stairs are formed by etching exposed region of the conductive structures. The individual stairs define contact regions of the conductive structures upon which contact structures can be positioned to provide electrical access to the conductive structures. Various processes of forming staircase structures have been developed.

Figure 1:
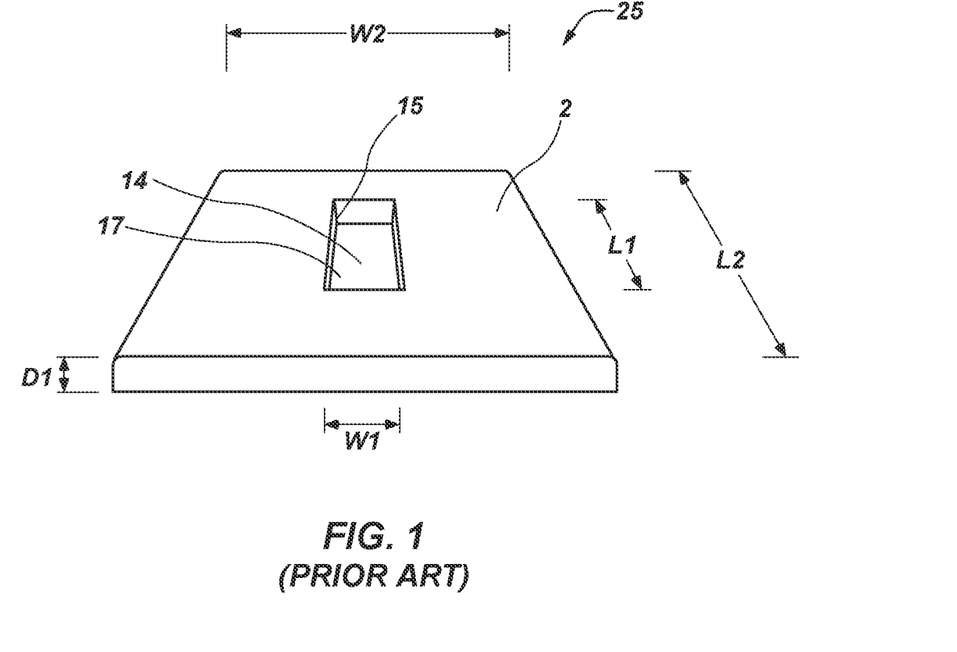
FIGS. 1, 2, 4A, and 4B are simplified, plan views illustrating initial acts in a conventional process of fabricating a staircase structure.

In one such fabrication process, a slot is formed in the alternating conductive structures and insulating structures before forming the staircase structure. Alternating conductive structures and insulating structures 2 are formed on a substrate (not shown) and a slot 14 is formed in the center of at least a portion of the alternating conductive structures and insulating structures 2, as shown in FIG. 1. For simplicity, the alternating conductive structures and insulating structures 2 are shown in FIG. 1 as a single material. The slot 14 extends from an uppermost surface of the alternating conductive structures and insulating structures 2 and into the alternating conductive structures and insulating structures 2 to a depth D1. The slot 14 also has a length L1 and a width W1. The slot 14 is defined by sidewalls 15 of the conductive structures and insulating structures 2 and a bottom surface 17 of the conductive structures and insulating structures 2. The sidewalls 15 are substantially vertical surfaces of exposed portions of the conductive structures and insulating structures 2 within the slot 14. The portion of alternating conductive structures and insulating structures 2 has a length L2 and a width W2.

Figure 2:
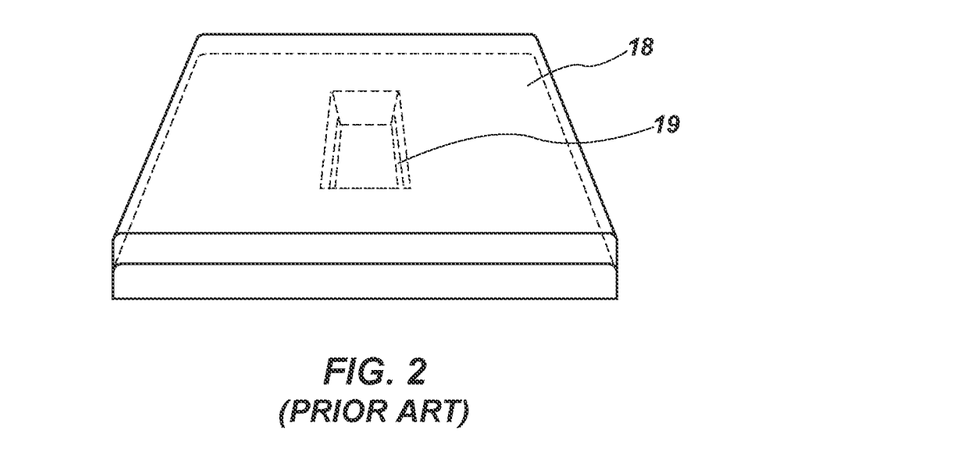
Figure 3:
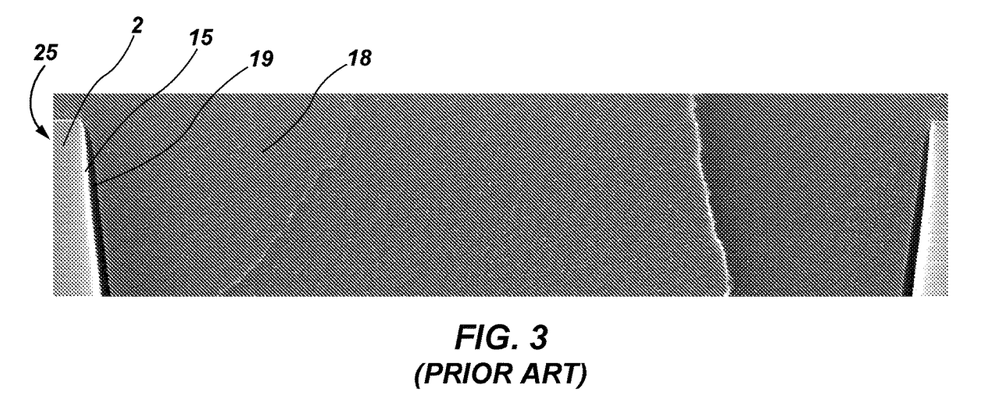
FIG. 3 is a scanning electron micrograph (SEM) showing the structure of FIG. 2 formed during the conventional process of fabricating the staircase structure.

A photoresist 18 is formed over the uppermost surface of the conductive structures and insulating structures 2 laterally adjacent to the slot 14, and over the sidewalls 15 and the bottom surface 17 of the alternating conductive structures and insulating structures 2 within the slot 14, as shown in FIG. 2. The photoresist 18, thus, contacts the sidewalls 15 of the conductive structures and insulating structures 2. Due to the large volume of photoresist 18 used and shrinkage in the photoresist 18 during and after its formation, delamination may occur at the sidewalls 15. The delamination may also be caused by poor adhesion between the photoresist 18 and the alternating conductive structures and insulating structures 2. As also shown in FIG. 2, because of the delamination, a so-called "creek" 19 may form along the bottom region of the sidewalls 15 of the slot 14 formed in the alternating conductive structures and insulating structures 2. Although not shown in FIG. 2 for simplicity, the creek 19 may also form throughout the sidewalls 15 of the slot 14 formed in the alternating conductive structures and insulating structures 2. A scanning electron micrograph (SEM) showing the photoresist 18 delaminating from the sidewalls 15 of the alternating conductive structures and insulating structures 2 is shown in FIG. 3.

Figure 4A:
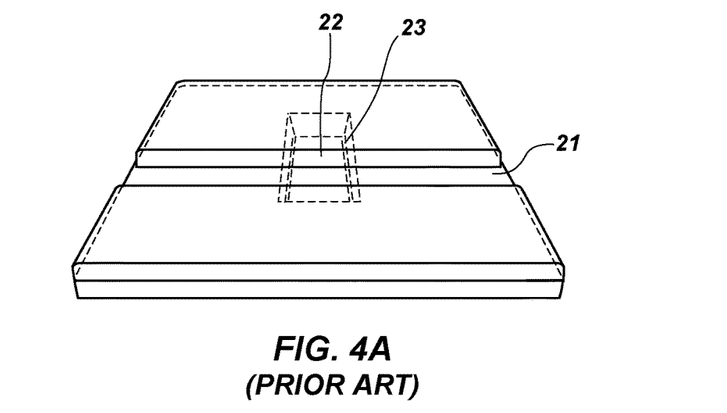
Figure 4B:
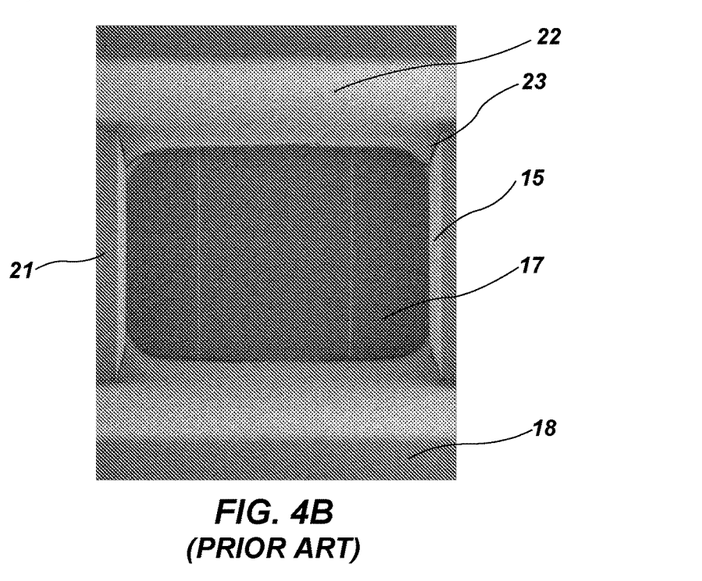
Figure 5A:
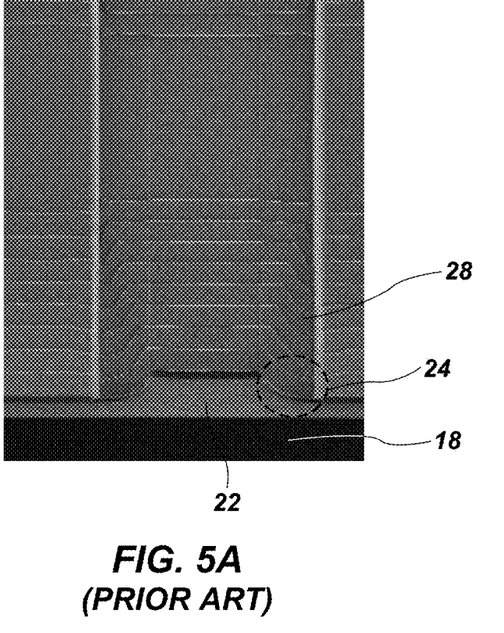
FIGS. 5A and 5B are SEMs of a staircase structure formed by the conventional process.
Figure 5B:
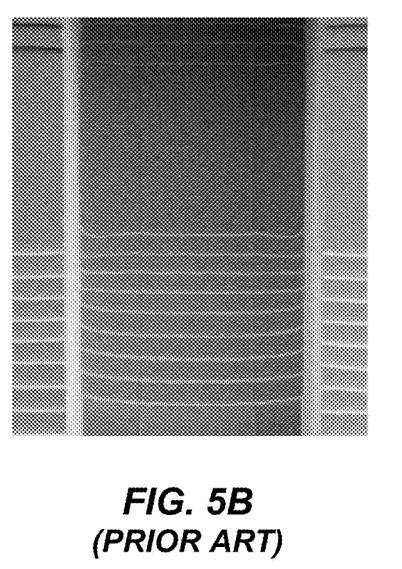

As shown in FIG. 4A, a portion of the photoresist 18 is removed (e.g., etched, trimmed) by conventional photolithography techniques, such as by a dry etch process, to form an opening 21 in the photoresist 18. The opening 21 exposes vertical surfaces 22 of the photoresist 18. The exposure, bake, and development acts involved in the dry etch process may cause the photoresist 18 to shrink further, widening the creek 19 to form a void 23 between the sidewalls 15 of the alternating conductive structures and insulating structures 2 and the photoresist 18. The etchants of the dry etch process may enter the creek 19, widening the creek 19 and forming the void 23. The creek 19 may be enclosed within the bulk of the photoresist 18/sidewall 15 interface and may not be visible during non-destructive imaging. FIG. 4B shows the creek 19 visible at the photoresist 18/sidewall 15 interface as it extends up to the surface 22. During the subsequent dry etch process, the conductive structures and insulating structures 2 exposed by the opening 21 are etched vertically and the photoresist 18 is trimmed, causing surface 22 to move laterally and causing the opening 21 to widen. The repeating etch-trim processes creates multiple "stair" like steps in the alternating conductive structures and insulating structures 2, which results in the "staircase" structure. Under the plasma conditions of the dry etch process during the staircase formation, the etchants/reaction byproducts of the etch may enter (e.g., fill) the creek 19, etching the photoresist 18 in the creek 19, continuously widening the creek 19, and forming the void 23, shown in FIG. 5. Stairs subsequently formed adjacent to the void 23 have the same profile of the photoresist 18, which results in the formation of deformed stairs in the staircase structure. The void 24 results in deformation (e.g., change) in the profile of the portion of photoresist surface 22 adjacent to the sidewalls 15. A portion of stairs subsequently formed adjacent to the sidewall 15 have the same deformed profile projected from the deformed photoresist surface 22, which results in the formation of deformed stair region 28 in the staircase structure. An SEM of the resulting staircase structure 25 is shown in FIGS. 5A and 5B, with a region including the deformed stairs circled and the void 23 shown. Since the stairs have the undesired deformed profile which is not consistent in shape, contact structures (not shown) subsequently formed on these stairs are not properly aligned, causing failure of a device including the staircase structure. In other words, the contact structures land unreliably on the incorrect conductive plates, causing the device failure. To avoid device failure, changes to the fabrication process have been made. However, these changes add considerable expense and time to the fabrication process.

BRIEF DESCRIPTION OF THE DRAWINGS

FIGS. 6-9 are cross-sectional views showing the fabrication process of a staircase structure in accordance with embodiments of the disclosure;

DETAILED DESCRIPTION

Methods of improving adhesion between a photoresist and alternating conductive structures and insulating structures of a staircase structure are described, as are methods of forming semiconductor device structures (e.g., memory array blocks) including staircase structures that have the photoresist and the alternating conductive structures and insulating structures. The fabrication of the staircase structures includes forming a slot having large dimensions in the alternating conductive structures and insulating structures. Recesses are formed in the conductive structures or in the insulating structures, laterally adjacent to the slot. A photoresist is formed over the conductive structures and insulating structures, including within the slot and recesses. The recesses enable increased adhesion between the photoresist and materials of the conductive structures and insulating structures. The improved adhesion enables the formation of stairs and contact structures on the stairs that are aligned. The staircase structure formed by the methods of the disclosure has reduced numbers of defects in the contact structures on the stairs. Thus, failure of a device including the staircase structure is reduced or eliminated compared to a device formed by a conventional process of forming the staircase structure.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a complete process flow for manufacturing semiconductor device structures and the structures described below do not form a complete semiconductor device structure. Only those process acts and structures necessary to understand the embodiments described herein are described in detail below. Additional acts to form a complete semiconductor device structure may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "vertical," "longitudinal," "horizontal," are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

Figure 6:
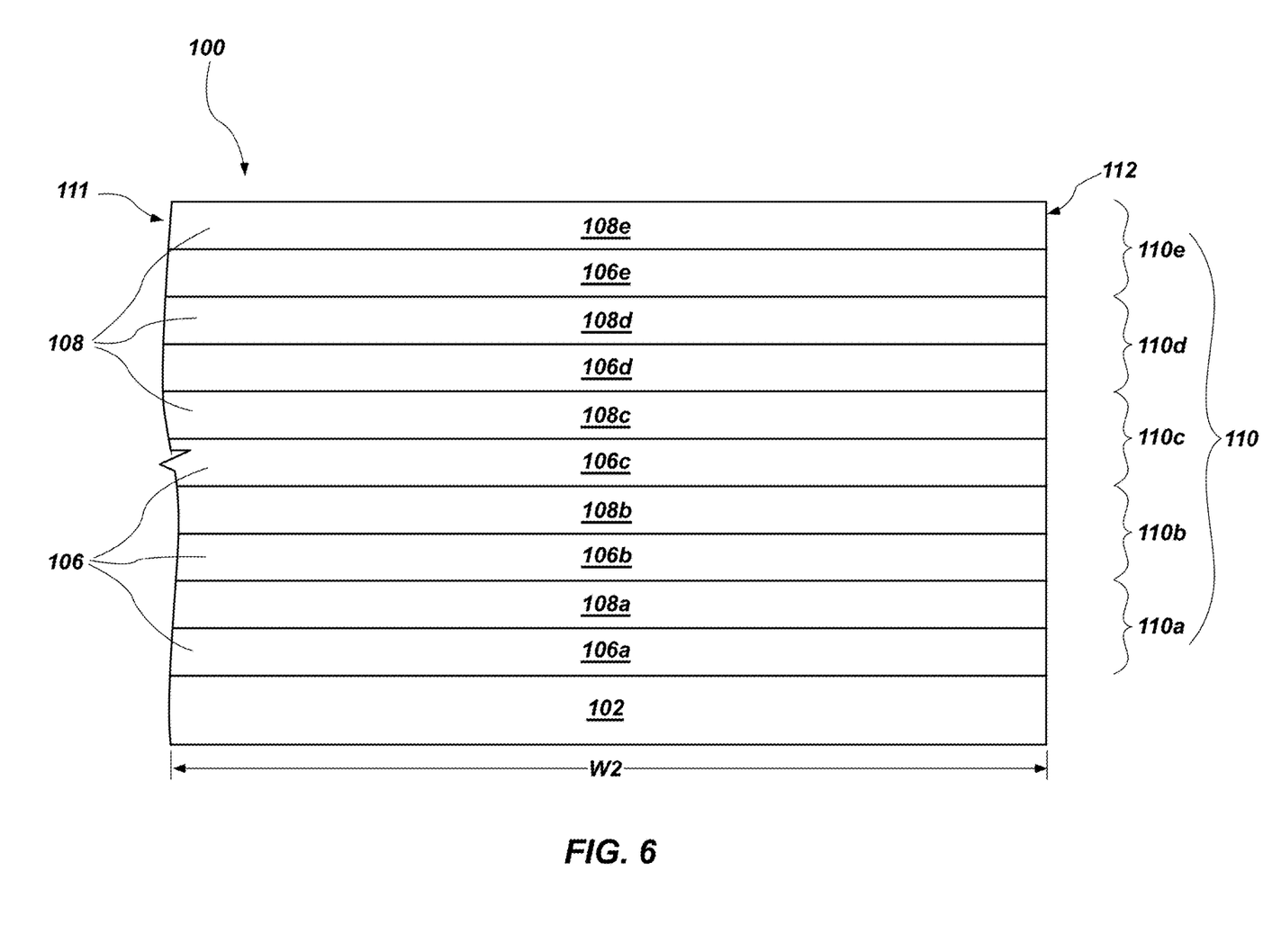

As shown in FIG. 6, a semiconductor structure 100 from which the staircase structure is to be formed may include a substrate 102, and alternating conductive structures 106 and insulating structures 108 arranged in tiers 110 over the substrate 102. For clarity and ease of understanding of the drawings and related description, FIG. 6 shows five (5) tiers 110 of the conductive structures 106 and the insulating structures 108. A first tier 110a includes a first conductive structure 106a and a first insulating structure 108a over the first conductive structure 106a; a second tier 110b overlies the first tier 110a, and includes a second conductive structure 106b and a second insulating structure 108b over the second conductive structure 106b; a third tier 110c overlies the second tier 110b, and includes a third conductive structure 106c and a third insulating structure 108c over the third conductive structure 106c; a fourth tier 110d overlies the third tier 110c, and includes a fourth conductive structure 106d and a fourth insulating structure 108d over the fourth conductive structure 106d; and a fifth tier 110e overlies the fourth tier 110d, and includes a fifth conductive structure 106e and a fifth insulating structure 108e over the fifth conductive structure 106e. However, the semiconductor structure 100 may include a different number of tiers 110. For example, in additional embodiments, the semiconductor structure 100 may include greater than five (5) tiers 110 (e.g., greater than or equal to ten (10) tiers 110, greater than or equal to twenty-five (25) tiers 110, greater than or equal to fifty (50) tiers 110, greater than or equal to one hundred (100) tiers 110, greater than or equal to five hundred (500) tiers 110, or greater than or equal to one thousand (1000) tiers 110) of the conductive structures 106 and the insulating structures 108, or may include less than five (5) tiers 110 (e.g., less than or equal to three (3) tiers 110) of the conductive structures 106 and the insulating structures 108.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor structure may include, but are not limited to, semiconductive materials, insulating materials, conductive materials, etc. One or more of the materials may be thermally sensitive. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The conductive structures 106 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel-and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. In one embodiment, the conductive structures 106 are formed from polysilicon. The conductive structure 106 may, for example, be formed of and include a stack of at least two different conductive materials. The conductive structures 106 may each be substantially planar, and may each independently exhibit any desired thickness. The thickness of each of the conductive structures 106 may range from about 1 nm to about 1000 nm, such as from about 1 nm to about 500 nm, from about 10 nm to about 500 nm, or from about 10 nm to about 250 nm. In one embodiment, the thickness of the conductive structures 106 ranges from about 10 nm to about 100 nm.

Each of the conductive structures 106 may be substantially the same (e.g., exhibit substantially the same material composition, average grain size, material distribution, size, and shape) as one another, or at least one of the conductive structures 106 may be different (e.g., exhibit one or more of a different material composition, a different average grain size, a different material distribution, a different size, and a different shape) than at least one other of the conductive structures 106. As a non-limiting example, each of the first conductive structure 106a, the second conductive structure 106b, the third conductive structure 106c, the fourth conductive structure 106d, and the fifth conductive structure 106e may exhibit substantially the same material composition, material distribution, and thickness. In some embodiments, each of the conductive structures 106 is substantially the same as each other of the conductive structures 106.

The insulating structures 108 may be formed of and include at least one insulating material, such as an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), amphorous carbon, or a combination thereof. In one embodiment, the insulating structures 108 are formed from a silicon oxide, such as silicon dioxide. The insulating structure 108 may also, for example, be formed of and include a stack (e.g., laminate) of at least two different insulating materials. The insulating structures 108 may each be substantially planar, and may each independently exhibit any desired thickness. The thickness of each of the insulating structures 108 may range from about 1 nm to about 1000 nm, such as from about 1 nm to about 500 nm, from about 10 nm to about 500 nm, or from about 10 nm to about 250 nm. In one embodiment, the thickness of the insulating structures 108 ranges from about 10 nm to about 100 nm.

Each of the insulating structures 108 may be substantially the same (e.g., exhibit substantially the same material composition, material distribution, size, and shape) as one another, or at least one of the insulating structures 108 may be different (e.g., exhibit one or more of a different material composition, a different material distribution, a different size, and a different shape) than at least one other of the insulating structures 108. As a non-limiting example, each of the first insulating structure 108a, the second insulating structure 108b, the third insulating structure 108c, the fourth insulating structure 108d, and the fifth insulating structure 108e may exhibit substantially the same material composition, material distribution, and thickness. In some embodiments, each of the insulating structures 108 is substantially the same as each other of the insulating structures 108.

The materials of the conductive structures 106 and the insulating structures 108 may be selected such that the conductive structures 106 and the insulating structures 108 are selectively etchable relative to one another.

As shown in FIG. 6, the conductive structures 106 and the insulating structures 108 are arranged in an alternating sequence on the substrate 102 beginning with one of the conductive structures 106. However, the conductive structures 106 and the insulating structures 108 may be arranged in a different sequence, such as beginning with one of the insulating structures 108. Accordingly, each of the tiers 110 may alternatively include one of the conductive structures 106 on or over one of the insulating structures 108. A semiconductor device (e.g., a vertical memory device, such as a 3D NAND Flash memory device; a crosspoint memory device, such as a 3D crosspoint memory device) employing a semiconductor device structure having such a configuration may have little or no difference in terms of functionality or operability as compared to a semiconductor device employing the arrangement of the conductive structures 106 and the insulating structures 108 shown in FIG. 6.

The substrate 102, the conductive structures 106, and the insulating structures 108 may each independently be formed using conventional processes including, but not limited to, physical vapor deposition ("PVD"), chemical vapor deposition ("CVD"), atomic layer deposition ("ALD"), and/or spin-coating. PVD includes, but is not limited to, one or more of sputtering, evaporation, precursor spin-coating/calcination, and ionized PVD. Such processes are known in the art and, therefore, are not described in detail herein.

Figure 7:
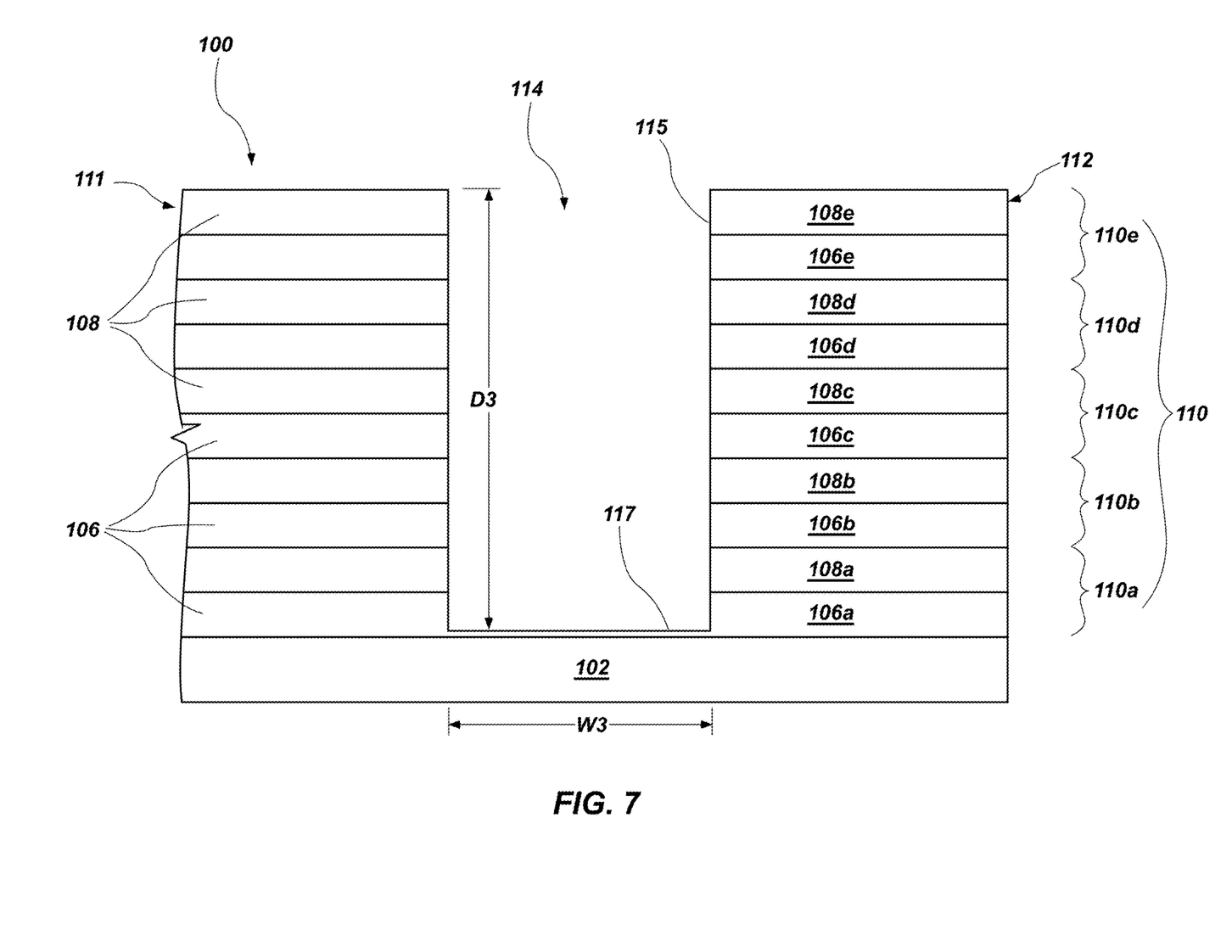

After forming the conductive structures 106 and the insulating structures 108, a portion of the conductive structures 106 and the insulating structures 108 is removed to form a slot 114 having a width W3 and a depth D3, as shown in FIG. 7. The slot 114 may be formed in the center of the tiers 110, similar to that shown in FIG. 1. While not shown in the perspective of FIG. 7, the slot also has a length L3. The length L3 of the slot 114 is less than the length L2 of the conductive structures 106 and the insulating structures 108. The length L3 of the slot 114 may depend on a length of the staircase ultimately to be formed. The width W3 of the slot 114 may be less than the width W2 of the conductive structures 106 and the insulating structures 108. The width W3 of the slot 114 may depend on a width of the staircase ultimately to be formed. The depth D3 of the slot 114 may be substantially equal to the depth D1 of the conductive structures 106 and the insulating structures 108. While FIG. 7 shows that the slot 114 is substantially centered across a width and length of the tiers 110, the position of the slot 114 may be different depending on the desired position of the staircase(s) ultimately to be formed. The slot 114 is formed by conventional techniques, exposing sidewalls 115 of the conductive structures 106 and the insulating structures 108, which are substantially vertical. A bottom surface 117 of the conductive structures 106 or of the insulating structures 108 is also exposed.

Figure 8A:
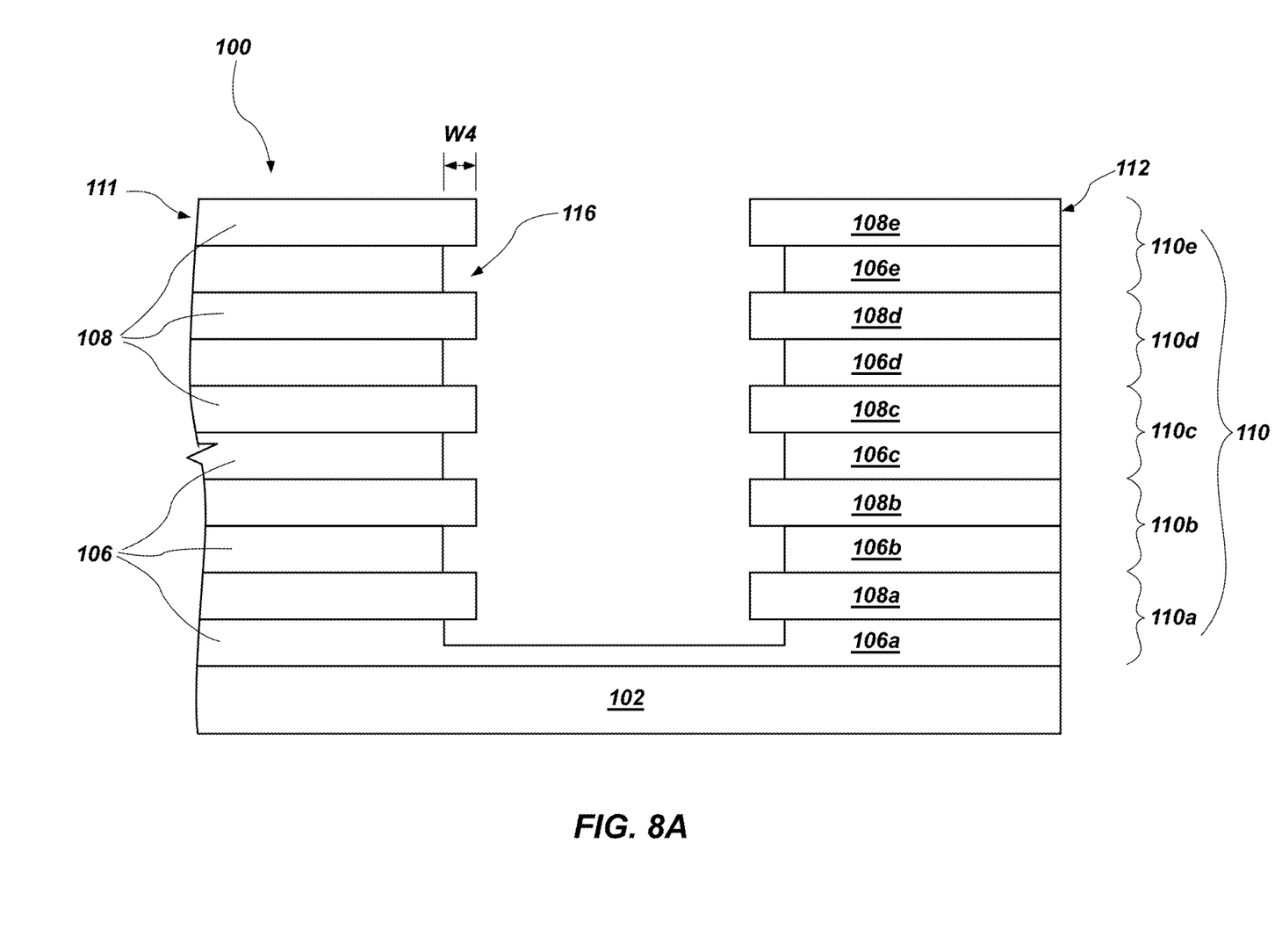
Figure 8B:
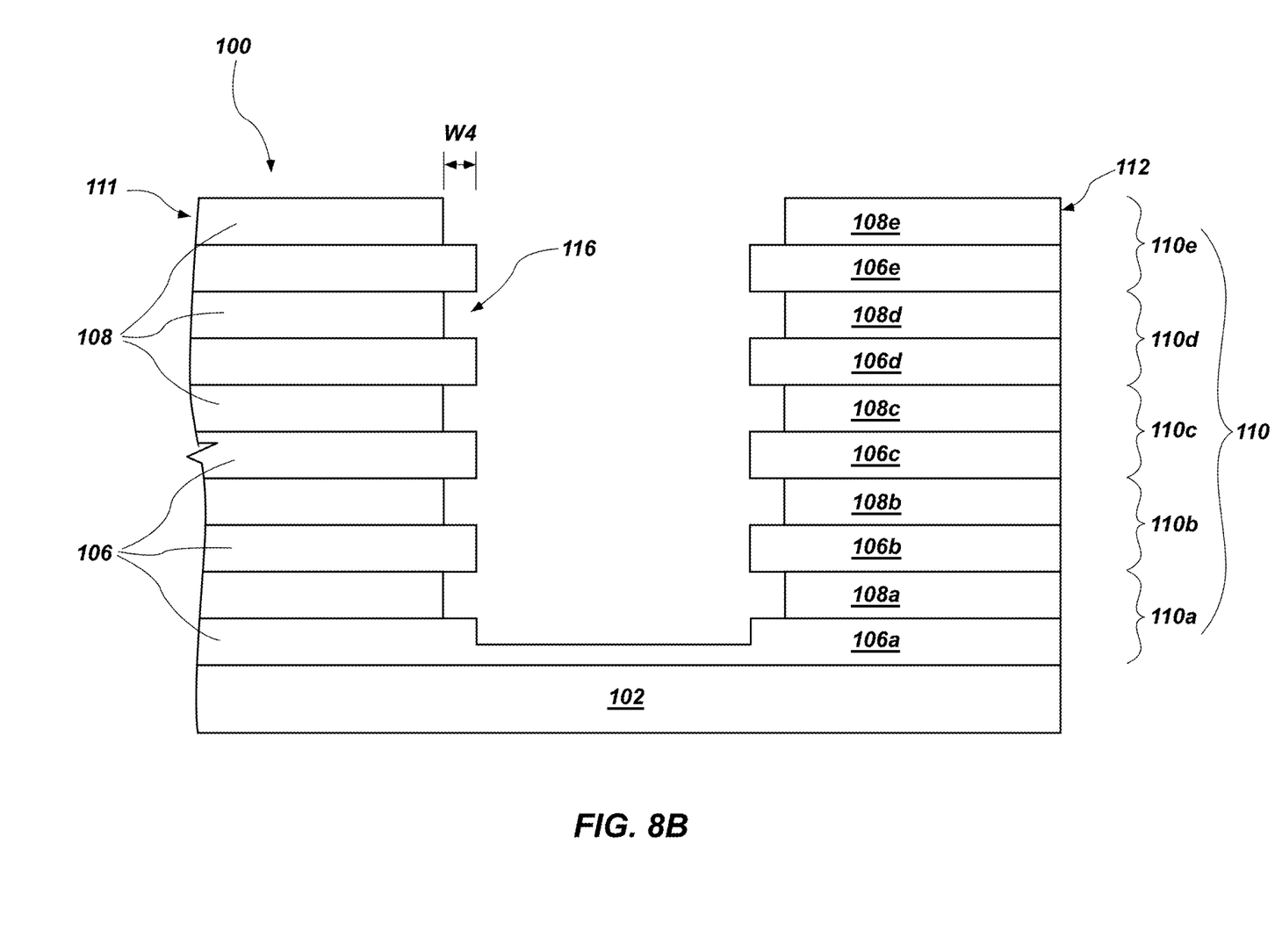

Portions of the conductive structures 106 or of the insulating structures 108 within the slot 114 may be selectively removed, forming recesses 116 in the conductive structures 106, as shown in FIG. 8A, or in the insulating structures 108, as shown in FIG. 8B. The portions of the conductive structures 106a-106e laterally adjacent to the slot 114 may be removed to form the recesses 116, creating a so-called "jagged" or "sawtooth" profile of the sidewalls 115 of the conductive structures 106a-106e and the insulating structures 108a-108e. The jagged profiles of the sidewalls 115 provide an increased surface area to the conductive structures 106 or to the insulating structures 108 in the slot 114 compared to the sidewalls 15 shown in FIG. 1. While FIG. 8A shows the recesses 116 in the conductive structures 106 having substantially planar (e.g., substantially vertical) and smooth surfaces, the surfaces may be nonplanar (e.g., curved, jagged) and rough. By removing portions of the conductive structures 106, the exposed surface area of the insulating structures 108 within the slot 114 is increased. Conversely, by removing portions of the insulating structures 108 laterally adjacent to the slot 114 and forming recesses in the insulating structures 108, the exposed surface area of the conductive structures 106 within the slot 114 is increased.

Dimensions of the recesses 116 may be sized and configured such that a photoresist may enter the recesses 116, as described in detail below. A width W4 of the recesses 116 may be from about 1 nm to about 100 nm from the sidewalls 115 of the slot 114. The dimensions of the recesses 116 may be optimized depending on the desired degree of adhesion between the photoresist and the conductive structures 106 and the insulating structures 108. Without being bound by any theory, larger dimensions of the recesses 116 may enable increased adhesion of the photoresist to the conductive structures 106 and the insulating structures 108 by increasing the surface area of the conductive structures 106 and the insulating structures 108 to which the photoresist 118 adheres. A height of the recesses 116 may be determined by the thickness at which the conductive structures 106 or the insulating structures 108 are formed and a length of the recesses 116 may be determined by the length L3 of the slot 114. Since the height and length of the recesses 116 are set by the desired dimensions of the staircase structure, increasing the width W4 of the recesses 116 increases the degree of photoresist adhesion.

The recesses 116 in the conductive structures 106 or in the insulating structures 108 are formed by selectively removing portions of the conductive structures 106 or of the insulating structures 108 by an etch process, such as a wet etch process or an isotropic, selective dry etch process. The selective wet etch process isotropically removes a portion of the conductive structures 106 or a portion of the insulating structures 108 adjacent to the slot 114, without substantially removing the portion of the insulating structures 108 or of the conductive structures 106, respectively. Since the wet etch process is isotropic, portions of the conductive structures 106 or the insulating structures 108 laterally adjacent to the slot 114 are selectively removed. The wet etch process may be conducted for an amount of time sufficient to form the recesses 116 at the desired width.

Conventional wet etch chemistries may be used to form the recesses 116 and may be selected depending on the materials used for the conductive structures 106 and the insulating structures 108. In one embodiment, the conductive structures 106 are formed of polysilicon and the insulating structures 108 are formed of silicon dioxide. By way of example only, to form the recesses 116 in polysilicon, a conventional buffered oxide etch (BOE) solution followed by a conventional tetramethylammonium hydroxide (TMAH) solution may be used as the wet etchants. The BOE solution may include hydrogen fluoride (HF) and ammonium fluoride ($NH_4F$) in water, as known in the art, and removes native oxide on the polysilicon surface. The TMAH solution removes the portions of the polysililcon, forming the recesses 116 in the polysilicon. The TMAH solution may include TMAH and water as known in the art. To form the recesses 116 in the silicon dioxide, a conventional BOE solution may be used as the wet etchant. However, other conventional wet etchants selective for polysilicon or silicon dioxide may be used in forming the recesses 116.

Figure 9:
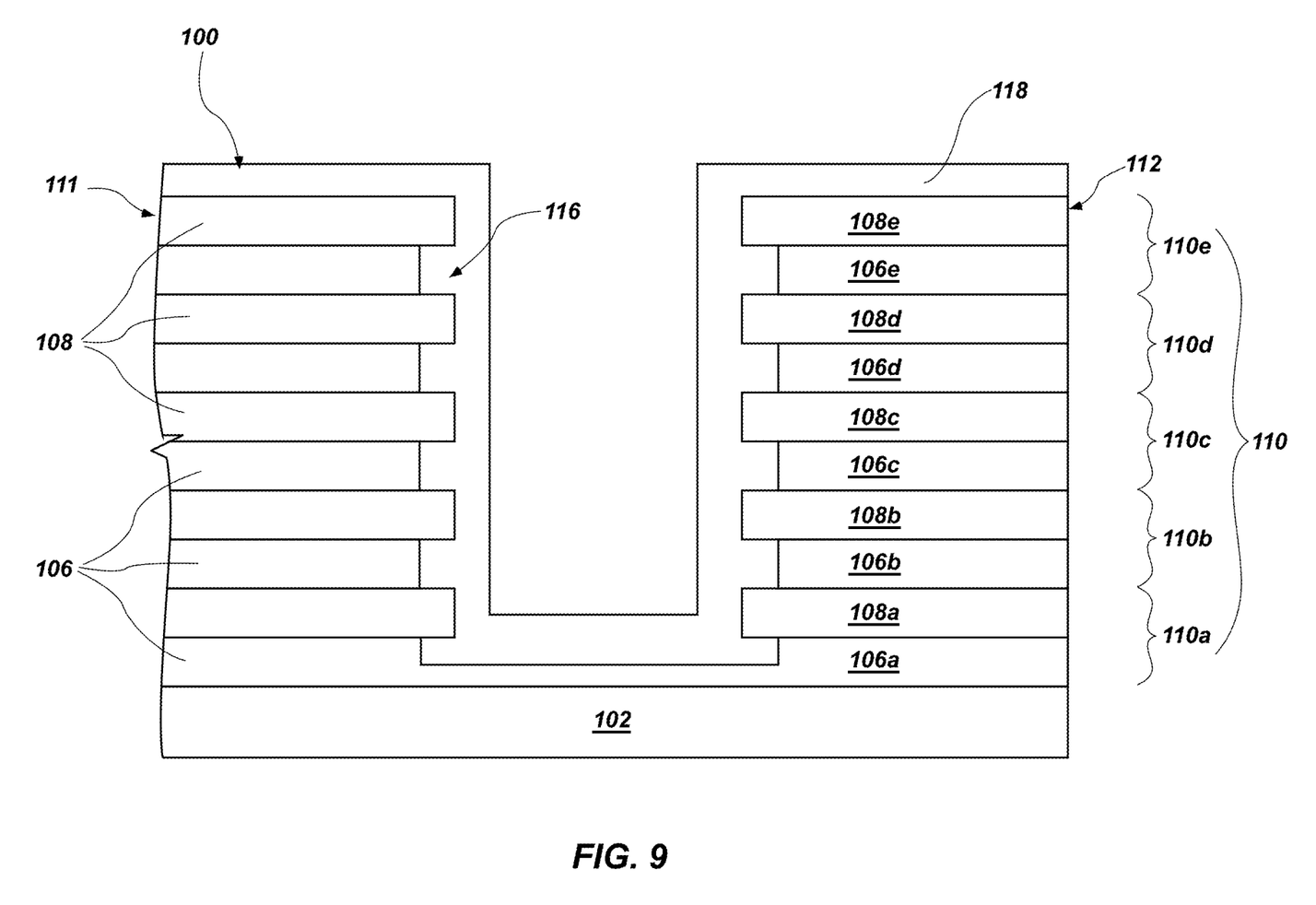

After forming the recesses 116, a photoresist 118 is formed over the tiers 110, including within the slot 114 and the recesses 116, as shown in FIG. 9. The photoresist 118 may be formed over horizontal surfaces of the uppermost tier 110e of the conductive structures 106e and the insulating structures 108e, over vertical surfaces of the tiers 110a-110d of the conductive structures 106a-106d and the insulating structures 108a-108d exposed within the slot 114, and within the recesses 116. A viscosity of the photoresist 118 may be such that the photoresist 118 flows over the tiers 110 and into the slot 114 and the recesses 116. The photoresist 118 may be a conventional 193 nm resist, a conventional 248 nm resist, a conventional 365 nm resist, or a conventional deep ultraviolet (DUV) resist. The photoresist 118 may exhibit a positive tone or a negative tone.

The photoresist 118 may be formed over the tiers 110 at a thickness sufficient to conduct the repeated trim acts utilized during subsequent acts to form the staircase structure. The photoresist 118 may, for example, be spin-coated over the tiers 110. While the photoresist 118 is shown as partially filling the slot 114, the photoresist 118 may substantially fill the slot 114. The pattern formed in the photoresist 118, after exposure and development, may serve as a mask to enable selective removal of (e.g., etch) portions of the tiers 110 of the conductive structures 106 and the insulating structures 108 to form the staircase structure. The pattern in the photoresist 118 may be formed orthogonal to the length of the slot. A thickness of the photoresist 118 may range from about 1 µm to about 10 µm, such as from about 8 µm to about 11 µm. At a thickness within this range and the relatively large area over which the photoresist 118 is formed, a large volume of photoresist 118 is used, which includes a large volume of solvent that needs to be removed during the application of the photoresist 118 and during pattern formation in photoresist 118 using photolithography or other lithography methods. The large volume and thickness of photoresist 118 utilized during the formation of the staircase structures is believed to contribute to the shrinkage and stress in the photoresist 118, causing delamination of the photoresist 118 from the sidewall 115. The delamination may also be caused by poor adhesion properties of the photoresist 118 to the conductive structures 106 and insulating structures 108. However, when the staircase structure is formed by a method according to the embodiments of the disclosure, the photoresist 118 may adhere to the conductive structures 106 and the insulating structures 108. Without being bound by any theory, it is believed that the increased surface area of the recesses 116 in the conductive structures 106 or in the insulating structures 108 improves the adhesion of the photoresist 118 to the conductive structures 106 and the insulating structures 108. The improved adhesion reduces or eliminates delamination of the photoresist 118, which reduces or eliminates defectively-formed stairs. Therefore, the staircase structure formed according to the embodiments of the disclosure may be substantially free of defects in the stairs of the staircase structure.

Additional process acts may be conducted to form a complete semiconductor device structure including the staircase structure. Additional process acts for fabricating the staircase structure and the complete semiconductor device structure may be conducted by conventional techniques, which are not described in detail herein. The repeated photoresist trim acts may be utilized to form the staircase structure. Generally, during each trim act, additional photoresist 118 is removed and the underlying conductive structures 106 and insulating structures 108 are etched using the remaining photoresist 118 as a mask. Following completion of the staircase structure, about 1 µm or less of the photoresist 118 may remain over the conductive structures 106 and insulating structures 108, and is subsequently removed. At least one contact structure may be formed on each of the stairs and coupled, such as electrically connected through a direct ohmic connection or through an indirect connection (e.g., via another structure electrically connected), to the conductive structures 106 of the tiers 110. The contact structures may be formed and coupled to the conductive structures 106 by conventional techniques, which are not described in detail herein. The contact structures may be coupled (e.g., attached, connected) to routing structures and at least one string driver device as known in the art.

The adhesion of the photoresist 118 to the conductive structures 106 and the insulating structures 108 of the tiers 110 may be further improved by treating the surfaces of the conductive structures 106 or of the insulating structures 108 before forming the photoresist 118 thereover. The surface treatment may include, but is not limited to, cleaning the surfaces of the conductive structures 106 and/or the insulating structures 108, forming inorganic spacers on the surfaces of the conductive structures 106 and/or the insulating structures 108, chemically modifying the surfaces of the conductive structures 106 and/or the insulating structures 108, nitridating the surfaces of the conductive structures 106 and/or the insulating structures 108, applying adhesion promoters to the surfaces of the conductive structures 106 and/or the insulating structures 108, or applying organic coating materials, such as bottom antireflective coating (BARC), to the surfaces of the conductive structures 106 and/or the insulating structures 108. However, the surface treatment alone (e.g., without also forming the recesses 116) may not be sufficient to adhere the photoresist 118 to the conductive structures 106 or of the insulating structures 108.

Figure 10A:
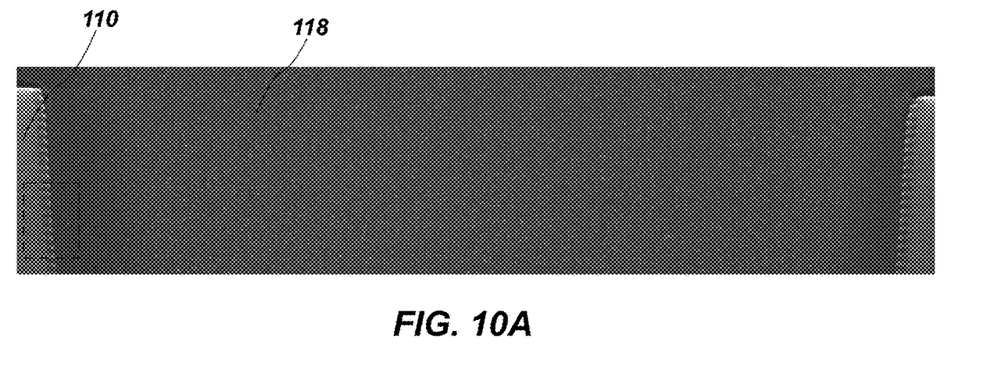
FIG. 10A is an SEM showing improved adhesion between a photoresist and tier materials in accordance with embodiments of the disclosure and FIG. 10B is an enlarged view of FIG. 10A.
Figure 10B:
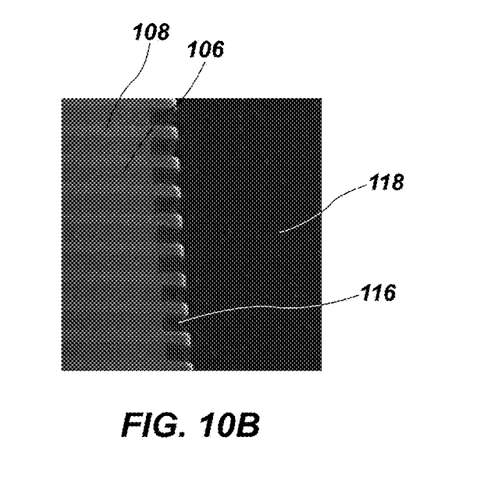
Figure 11:
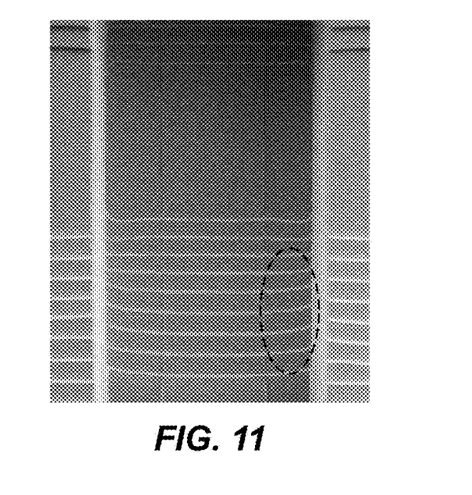
FIG. 11 is an SEM of a staircase structure formed in accordance with embodiments of the disclosure.

As shown in FIG. 10A, which is a SEM of a semiconductor structure formed according to embodiments of the disclosure, the photoresist 118 is formed in the recesses 116 of the conductive structures 106. There is good adhesion (e.g., no delamination) between the photoresist 118 and the conductive structures 106 and the insulating structures 108. Comparing FIG. 10A to FIG. 10B, which is an enlarged view of FIG. 10A, the recesses 116 formed according to embodiments of the disclosure enable improved adhesion of the photoresist 118 to the tiers 110 and, therefore, the photoresist 118 does not delaminate. A SEM of the staircase structure at a later stage in the fabrication process is shown in FIG. 11. No defects in the stairs of the staircase structure are observed in the circled region. Comparing FIG. 11 to FIG. 5, the staircase structure formed according to embodiments of the disclosure had no deformations in the stairs. Without being bound by any theory, it is believed that the increased surface area provided by the recesses 116 within the tiers 110 improves the adhesion of the photoresist 118 to the conductive structures 106 and the insulating structures 108. The improved adhesion reduces or eliminates the deformation in the stairs of the staircase structure.

Figure 12:
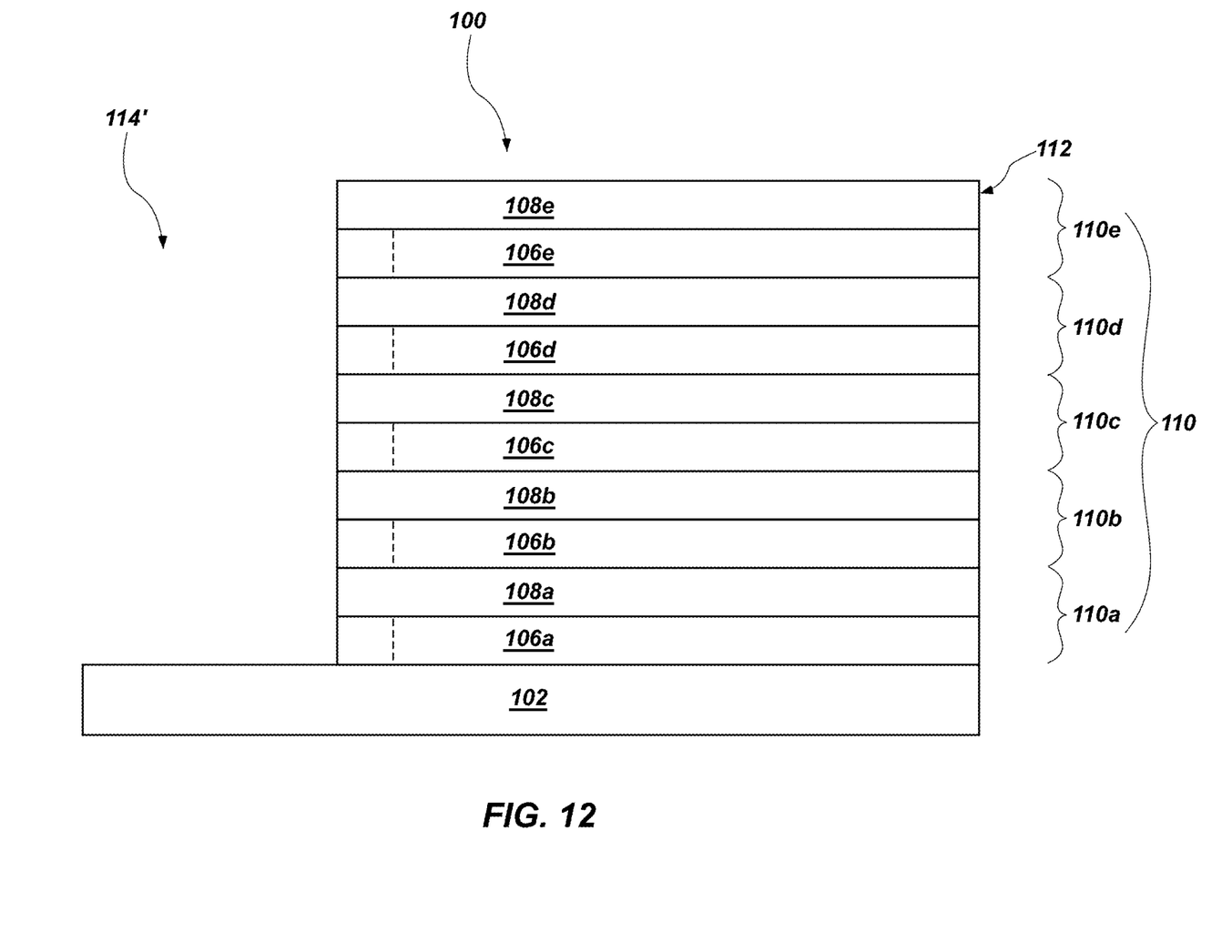
FIG. 12 is a cross-sectional view showing the fabrication process of a staircase structure in accordance with another embodiment of the disclosure.

The method of improving photoresist adhesion may be used in 3D NAND structures having staircase structures, such as 3D NAND structures having dual decks of staircase structures. While embodiments of the disclosure describe improving adhesion between a large volume of photoresist 118 and materials of alternating conductive structures 106 and insulating structures 108 during the fabrication of the staircase structures, embodiments of the disclosure may be applicable to other situations in which a large volume of photoresist 118 is to be formed in a slot having relatively large dimensions. By way of example only, the position of the slot 114 may differ from that shown in FIG. 7, depending on the desired position of the staircase(s) ultimately to be formed. As shown in FIG. 12, a slot 114' may be formed in a peripheral region of the alternating conductive structures 106 and insulating structures 108 of the staircase structure ultimately to be formed, rather than in an array region as described above. As shown by dashed lines in FIG. 12, recesses 116 may be formed in the conductive structures 106 before applying the photoresist 118, as described above, to improve adhesion of the photoresist 118 to the insulating structures 108. Alternatively, recesses 116 may be formed in the insulating structures 108 before applying the photoresist 118, as described above, to improve adhesion of the photoresist 118 to the conductive structures 106.

Embodiments of the disclosure may also be used when a large volume of a spin-on dielectric (SOD) material is to be formed in the slot 114, 114'. Recesses 116 may be formed in the conductive structures 106 or in the insulating structures 108 before applying the SOD material, as described above, to improve adhesion of the SOD material to the conductive structures 106 or the insulating structures 108.

Additional process acts may be conducted to form the 3D NAND Flash memory device. For example, a channel material may be formed and extend through the alternating conductive structures 106 and the insulating structures 108, and memory cells may be formed along the channel material. Such process acts to form the 3D NAND Flash memory device are known in the art and are not described in detail herein.

The method of improving photoresist adhesion may also be used in the formation of other 3D semiconductor devices, such as in a 3D crosspoint memory device, in which improved photoresist adhesion to conductive materials and insulating materials is desired.

Accordingly, a method of improving adhesion between a photoresist and conductive or insulating structures is disclosed. The method comprises forming a slot through at least a portion of alternating conductive structures and insulating structures on a substrate. Portions of the conductive structures or of the insulating structures are removed to form recesses in the conductive structures or in the insulating structures. A photoresist is formed over the alternating conductive structures and insulating structures and within the slot.

Accordingly, a method of improving adhesion between a spin-on dielectric material and conductive or insulating structures is disclosed. The method comprises forming a slot through tiers of conductive structures and insulating structures on a substrate. Recesses in the conductive structures or in the insulating structures are selectively formed. A spin-on dielectric material is formed over the tiers and within the slot.

Accordingly, a method of forming a staircase structure is disclosed. The method comprises forming a slot through tiers of conductive structures and insulating structures on a substrate. Recesses are selectively formed in the conductive structures or in the insulating structures. A photoresist is formed over the tiers and within the slot and recesses. Repeated trim acts of the photoresist are conducted to form stairs of the staircase structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of improving adhesion between a photoresist and conductive or insulating structures, comprising:
    forming a slot through at least a portion of alternating conductive structures and insulating structures, the slot defined by substantially vertical sidewalls in the alternating conductive structures and the insulating structures;
    selectively removing portions of the conductive structures or portions of the insulating structures to selectively form recesses laterally adjacent to the slot in one of the conductive structures or the insulating structures; and
    forming a photoresist adjacent the alternating conductive structures and insulating structures and within the slot and within the recesses.

2. The method of claim 1, wherein forming a slot through at least a portion of alternating conductive structures and insulating structures comprises forming the slot through alternating polysilicon structures and silicon dioxide structures.

3. The method of claim 1, wherein forming a slot through at least a portion of alternating conductive structures and insulating structures comprises forming the slot through alternating tungsten structures and silicon dioxide structures.

4. The method of claim 1, wherein forming a slot through at least a portion of alternating conductive structures and insulating structures comprises forming the slot through alternating polysilicon structures and silicon nitride structures.

5. The method of claim 1, wherein selectively removing portions of the conductive structures or portions of the insulating structures to selectively form recesses laterally adjacent to the slot in one of the conductive structures or the insulating structures comprises selectively forming the recesses in the conductive structures.

6. The method of claim 1, wherein selectively removing portions of the conductive structures or portions of the insulating structures to selectively form recesses laterally adjacent to the slot in one of the conductive structures or the insulating structures comprises selectively forming the recesses in the insulating structures.

7. The method of claim 1, wherein selectively removing portions of the conductive structures or portions of the insulating structures to selectively form recesses laterally adjacent to the slot in one of the conductive structures or the insulating structures comprises increasing the surface area of the conductive structures.

8. The method of claim 1, wherein selectively removing portions of the conductive structures or portions of the insulating structures to selectively form recesses laterally adjacent to the slot in one of the conductive structures or the insulating structures comprises increasing the surface area of the insulating structures.

9. The method of claim 1, wherein selectively removing portions of the conductive structures or portions of the insulating structures to selectively form recesses laterally adjacent to the slot in one of the conductive structures or the insulating structures comprises selectively recessing material of the conductive structures or of the insulating structures adjacent to the slot at from about 30 nm to about 60 nm.

10. A method of improving adhesion between a spin-on dielectric material and conductive or insulating structures, comprising:
forming a slot through tiers of conductive structures and insulating structures;
selectively forming recesses in the conductive structures or in the insulating structures; and
forming a spin-on dielectric material adjacent the tiers and within the slot and within the recesses to fill the slot and the recesses with the spin-on dielectric material.

11. The method of claim 10, wherein selectively forming recesses in the conductive structures or in the insulating structures comprises selectively removing portions of the conductive structures or of the insulating structures laterally adjacent the slot.

12. A method of forming a staircase structure, comprising:
forming a slot through at least a portion of alternating conductive structures and insulating structures on a material;
removing portions of the conductive structures or of the insulating structures to form recesses in the conductive structures or in the insulating structures;
forming a photoresist adjacent the alternating conductive structures and insulating structures and within the slot, the photoresist filling the recesses in the conductive structures or the insulating structures; and
conducting repeated trim acts of the photoresist to form stairs of the staircase structure.

13. The method of claim 12, wherein forming a slot through at least a portion of alternating conductive structures and insulating structures comprises forming the slot adjacent an array region.

14. The method of claim 12, wherein forming a slot through at least a portion of alternating conductive structures and insulating structures comprises forming the slot adjacent a peripheral region.

15. The method of claim 12, wherein removing portions of the conductive structures or of the insulating structures to form recesses comprises forming the recesses comprising a width of from about 1 nm to about 100 nm.

16. The method of claim 12, wherein forming a photoresist adjacent the alternating conductive structures and insulating structures and within the slot comprises forming the photoresist at a thickness of from about 1 µm to about 10 µm.

17. The method of claim 12, wherein conducting repeated trim acts of the photoresist to form stairs of the staircase structure comprises forming the stairs in the alternating conductive structures and insulating structures.

18. A method of forming a staircase structure, comprising:
forming a slot through tiers of conductive structures and insulating structures;
selectively forming recesses in the conductive structures;
forming a photoresist over the tiers and within the slot and recesses, the photoresist filling the recesses in the conductive structures; and
conducting repeated trim acts of the photoresist to form stairs of the staircase structure.

19. The method of claim 18, wherein forming a slot through tiers of conductive structures and insulating structures comprises forming the slot through greater than or equal to fifty tiers of conductive structures and insulating structures.

20. The method of claim 18, wherein forming a slot through tiers of conductive structures and insulating structures comprises forming the slot through greater than or equal to one hundred tiers of conductive structures and insulating structures.

21. A method of forming a staircase structure, comprising:
forming a slot through at least a portion of alternating conductive structures and insulating structures on a material;
removing portions of the insulating structures to form recesses in the insulating structures;
forming a photoresist adjacent the alternating conductive structures and insulating structures and within the slot and recesses, the photoresist filling the recesses in the insulating structures; and
conducting repeated trim acts of the photoresist to form stairs of the staircase structure.

* * * * *